US009972616B2

(12) United States Patent
Hafez et al.

(10) Patent No.: US 9,972,616 B2
(45) Date of Patent: May 15, 2018

(54) METHODS OF FORMING TUNEABLE TEMPERATURE COEFFICIENT FR EMBEDDED RESISTORS

(71) Applicant: INTEL CORPORATION, Santa Clara, CA (US)

(72) Inventors: Walid Hafez, Portland, OR (US); Chen-Guan Lee, Hillsboro, OR (US); Chia-Hong Jan, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 0 days. days.

(21) Appl. No.: 14/909,980

(22) PCT Filed: Sep. 27, 2013

(86) PCT No.: PCT/US2013/062164
§ 371 (c)(1),
(2) Date: Feb. 3, 2016

(87) PCT Pub. No.: WO2015/047294
PCT Pub. Date: Apr. 2, 2015

(65) Prior Publication Data
US 2016/0181241 A1    Jun. 23, 2016

(51) Int. Cl.
*H01L 21/70* (2006.01)
*H01L 21/20* (2006.01)
(Continued)

(52) U.S. Cl.
CPC ........... *H01L 27/0629* (2013.01); *H01C 7/06* (2013.01); *H01C 17/232* (2013.01); *H01L 28/20* (2013.01);
(Continued)

(58) Field of Classification Search
CPC .................................................. H01L 27/0629
(Continued)

(56) References Cited

U.S. PATENT DOCUMENTS

| 5,489,547 A | 2/1996 | Erdeljac et al. |
| 6,621,404 B1 * | 9/2003 | Banerjee ............... H01C 7/006 |
| | | 257/E21.004 |

(Continued)

FOREIGN PATENT DOCUMENTS

| CN | 102664180 | 9/2012 |
| CN | 102832219 | 12/2012 |

OTHER PUBLICATIONS

Office Action including Search Report (8 pages) dated Aug. 25, 2016 issued by the Examiner of the Intellectual Property Office (the IPO) for Taiwan Patent Application No. 103133280 and English Translation thereof (5 pages).

(Continued)

*Primary Examiner* — Igwe U Anya
(74) *Attorney, Agent, or Firm* — Schwabe, Williamson & Wyatt, P.C.

(57) ABSTRACT

Methods of forming resistor structures with tunable temperature coefficient of resistance are described. Those methods and structures may include forming an opening in a resistor material adjacent source/drain openings on a device substrate, forming a dielectric material between the resistor material and the source/drain openings, and modifying the resistor material, wherein a temperature coefficient resistance (TCR) of the resistor material is tuned by the modification. The modifications include adjusting a length of the resistor, forming a compound resistor structure, and forming a replacement resistor.

19 Claims, 10 Drawing Sheets

(51) Int. Cl.
    *H01L 27/06* (2006.01)
    *H01L 49/02* (2006.01)
    *H01L 29/66* (2006.01)
    *H01L 29/775* (2006.01)
    *H01C 7/06* (2006.01)
    *H01C 17/232* (2006.01)

(52) U.S. Cl.
    CPC .. *H01L 29/66439* (2013.01); *H01L 29/66469* (2013.01); *H01L 29/775* (2013.01); *H01L 28/24* (2013.01)

(58) Field of Classification Search
    USPC .......................................... 257/380; 438/382
    See application file for complete search history.

(56) References Cited

U.S. PATENT DOCUMENTS

| | | |
|---|---|---|
| 2006/0027878 A1 | 2/2006 | Chinthakindi et al. |
| 2006/0046418 A1 | 3/2006 | Coolbaugh et al. |
| 2006/0145296 A1 | 7/2006 | Coolbaugh et al. |
| 2007/0281418 A1 | 12/2007 | Hu et al. |
| 2009/0090977 A1* | 4/2009 | Freeman ........... H01L 21/28088 257/379 |
| 2012/0001679 A1* | 1/2012 | Privitera ................ H01C 7/006 327/524 |
| 2012/0171838 A1 | 7/2012 | Privitera |
| 2012/0180563 A1* | 7/2012 | Wang ...................... G01F 1/692 73/204.26 |
| 2012/0181612 A1* | 7/2012 | Yang .................... H01L 27/0629 257/364 |
| 2013/0049168 A1* | 2/2013 | Yang ...................... H01L 28/20 257/538 |
| 2013/0093024 A1 | 4/2013 | Eshun |
| 2013/0105912 A1* | 5/2013 | Hsu ..................... H01L 27/0629 257/379 |
| 2013/0168816 A1* | 7/2013 | Kang ..................... H01L 28/24 257/536 |
| 2013/0200466 A1 | 8/2013 | Zhao et al. |
| 2013/0307074 A1* | 11/2013 | Cheng .................... H01L 21/84 257/347 |

OTHER PUBLICATIONS

Decision of Rejection (5 pages) dated Jan. 25, 2017 issued by the Examiner of the Intellectual Property Office (the IPO) for Taiwan Patent Application No. 103133280 and English Translation thereof (3 pages).
Notification of Transmittal of the International Search Report and the Written Opinion of the International Searching Authority for PCT/US2013/062164 filed Sep. 27, 3013, dated Jun. 26, 2014, 13 pages.
European Communication pursuant to Rule 164(1) EPC for EP Application No. 13 89 4081.2, dated Apr. 20, 2017, 12 pages.
Office Action for Chinese Patent Application No. 201380079153.3 dated Feb. 2, 2018, 7 pages.

* cited by examiner

US 9,972,616 B2

METHODS OF FORMING TUNEABLE TEMPERATURE COEFFICIENT FR EMBEDDED RESISTORS

This patent application is a U.S. National Phase application under 35 U.S.C. 371 of International Application No. PCT/US2013/062164 filed Sep. 27, 2013.

BACK GROUND OF THE INVENTION

As microelectronic technology advances for higher performance, device dimensions are shrinking, which becomes a challenge when fabricating device features for optimal performance. For example, dimensional scaling increases the contact resistance of a polysilicon resistor due to generational reduction of the contact area. High contact resistance can induce more resistance variation, and reduced temperature coefficient of resistance (TCR) of the polysilicon resistor. Additionally, as device architecture becomes more vertical, such as in the case of three dimensional transistor structures, such as FINFET, or other multi-gate transistor devices, the scaling of the contact area for resistor structures becomes more important.

BRIEF DESCRIPTION OF THE DRAWINGS

While the specification concludes with claims particularly pointing out and distinctly claiming certain embodiments, the advantages of these embodiments can be more readily ascertained from the following description of the invention when read in conjunction with the accompanying drawings in which:

DETAILED DESCRIPTION OF THE PRESENT INVENTION

Figure 1A:
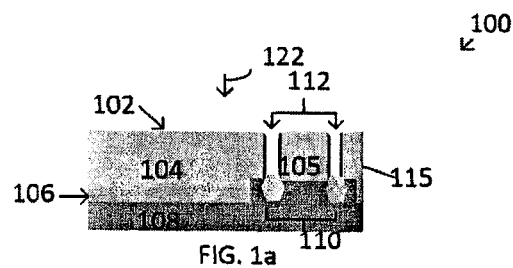
FIGS. 1a-1h represent cross-sectional views of structures according to various embodiments.

In the following detailed description, reference is made to the accompanying drawings that show, by way of illustration, specific embodiments in which the methods and structures may be practiced. These embodiments are described in sufficient detail to enable those skilled in the art to practice the embodiments. It is to be understood that the various embodiments, although different, are not necessarily mutually exclusive. For example, a particular feature, structure, or characteristic described herein, in connection with one embodiment, may be implemented within other embodiments without departing from the spirit and scope of the embodiments. In addition, it is to be understood that the location or arrangement of individual elements within each disclosed embodiment may be modified without departing from the spirit and scope of the embodiments. The following detailed description is, therefore, not to be taken in a limiting sense, and the scope of the embodiments is defined only by the appended claims, appropriately interpreted, along with the full range of equivalents to which the claims are entitled.

In the drawings, like numerals may refer to the same or similar functionality throughout the several views.

Methods and associated structures of forming and utilizing microelectronic structures, such as device structures comprising strained source/drain structures, are described. Those methods/structures may include forming an opening in a resistor material adjacent source/drain openings on a device substrate, forming a dielectric material between the resistor material and the source/drain openings, and modifying the resistor material, wherein a temperature coefficient resistance (TCR) of the resistor material is tuned by the modification. The modifications include adjusting a length of the resistor, forming a compound resistor structure, and forming a replacement resistor. A contact material adjacent the resistor and in the source/drain openings may then be formed. The embodiments herein enable tuning of a TCR which enable precision resistors with zero TCR values.

FIGS. 1a-1h illustrate views of embodiments of forming microelectronic structures, such as a tunable TCR resistor structures, wherein the TCR is tuned by adjusting a poly length. In an embodiment, a device 100 may comprise a substrate portion 108 (FIG. 1a). In an embodiment, the substrate 104 may comprise at least one of a silicon, a non-silicon material, a single crystal silicon material, a polysilicon material, a piezoelectric material, III-V material and/or other electromechanical substrate material. In an embodiment, the device 100 may comprise a portion of a planar transistor, a multi-gate transistor, such as a tri-gate and/or finFET transistor, and a nanowire structure.

The device 100 may further comprise a gate structure 105, which may comprise a portion of a transistor gate structure 105, such as planar, multi-gate, or a nanowire transistor structure. The gate structure 105 may comprise undoped polysilicon, in an embodiment. The gate structure 105 may further comprise source/drain openings 112 that are disposed adjacent the gate structure 105. Source/drain regions 110 may be disposed in the substrate 108, and may be adjacent the gate structure 105.

The source/drain regions 110 may comprise doped portions of the substrate 108, and may couple with the source/drain openings 112. In an embodiment, a mask, such as a hard mask material 102, may cover a resistor material 104 during an etching process 122 to form the source/drain openings 112. In an embodiment, the resistor material 104 may comprise an undoped polysilicon 104. In an embodiment, the gate structure 105 and an isolation region 115 may comprise polysilicon. In an embodiment, an isolation material, such as a dielectric material, may be disposed between the resistor material 104 and the substrate 108.

Figure 1B:
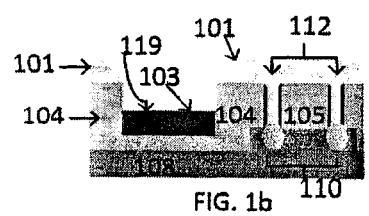

The resistor material 104 may be patterned and etched using a photoresist material 101, and the resistor material may be doped to form a doped resistor material 103 (FIG. 1b). A resistor recess 119 may be formed in the resistor material 103. The depth of the recess 119 formed in the resistor material 104 may depend upon the particular application. In an embodiment, the resistor material 104 of FIG. 1a may be recessed prior to the doping of the resistor material 104 to form the doped resistor material 103.

In an embodiment, the doped resistor material 103 may comprise a boron doped resistor material, although the resistor material 104 may be doped with any suitable doping element, according to the particular application. In an embodiment, a resistivity of the doped resistor material 103 may be established by the type and quantity of the dopant, as well as additional process parameters of the doping process. In an embodiment, a temperature coefficient of resistance (TCR) for the doped resistor material 103 may comprise about 200 ppm/° C. In some cases, the TCR may comprise about 100 ppm/° C. to about 300 ppm/° C., in other cases, the TCR of the doped resistor material 103 may comprise a negative TCR.

Figure 1C:
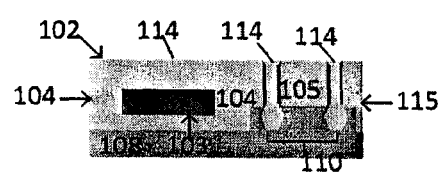
Figure 1D:
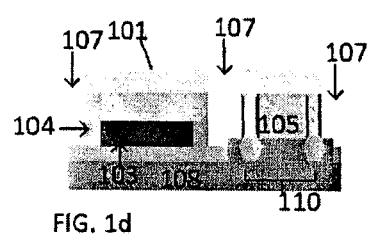
Figure 1E:
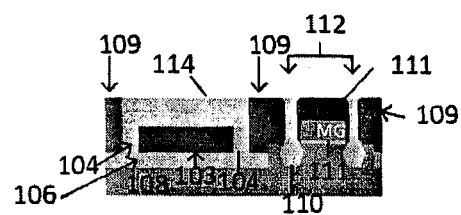

In an embodiment, a dielectric material 114 may be formed on the doped resistor material 103 in the recess and in the source drain openings 112 (FIG. 1c). The isolation material 114 may be planarized. A masking material 101 may be formed over the doped resistor 103 and over the undoped resistor 104, as well as over the transistor area comprising the metal gate 105 and the source/drain regions 110 (FIG. 1d). Isolation openings 107 may be formed adjacent the source/drain regions 110. Isolation material, such as a dielectric material 109, may be formed in the isolation openings (FIG. 1e). A metal gate 111 may be formed to replace the gate structure 105 material.

Figure 1F:
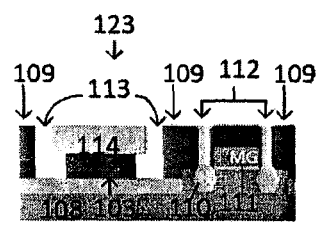

The undoped poly material 104 adjacent the doped resistor 103 may be removed exposing resistor contact openings 113 (FIG. 1f). The undoped poly material 104, which may comprise anode and cathode structures of the doped resistor 103, may be removed using etching processes such as a dry etch process in an embodiment. In an embodiment, the doped resistor 103 may be over etched 123 to form an undercut resistor structure 103'. The over etch 123 may be achieved by a wet etch, in an embodiment. In an embodiment, the extra/over etch may be used to tune a TCR of the doped resistor, since by tuning the doped resistor 103 length, the TCR can be adjusted according to design needs. In an embodiment, the TCR range may be determined by the doped resistor 103 and a contact interface to be described subsequently herein. In an embodiment, the dielectric material 114 may mask a portion of the doped resistor 103 during the over etch 123.

Figure 1G:
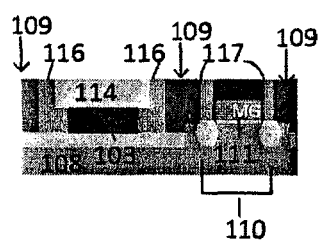
Figure 1H:
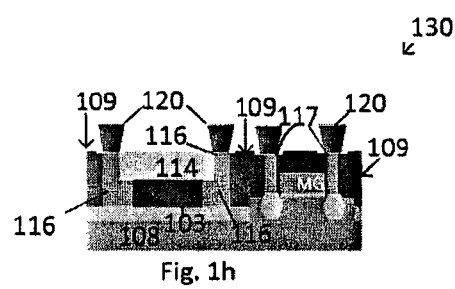

In an embodiment, a contact material 116, 117 may be formed in the source/drain openings 112 and adjacent the doped resistor 103 (FIG. 1g). In an embodiment, the contact material may be formed simultaneously adjacent the doped resistor 103 and in the source/drain openings 112 to form resistor contacts 116 and source/drain 117. In an embodiment, the contact material 116, 117 may comprise the same material for the resistor contacts and the source/drain contacts, in other embodiments, the contact material may be different for resistor and source/drain contacts. In an embodiment, conductive interconnect structures 120 may be formed to connect with the resistor contacts 116 and the source/drain contacts 117 (FIG. 1h). The device 130 comprising the tuneable resistor structure 103 allows for the adjustment of the doped poly 103 length, wherein the TCR of the doped poly resistor 103 can be targeted according to the particular design requirements. In an embodiment, the resistor contact 116 may comprise an "L" shape.

FIGS. 2a-2h illustrate views of embodiments of forming microelectronic resistor structures, such as a tunable TCR resistor structures, wherein the TCR is tuned by forming a contact material on the resistor adjusting a poly length for example. In an embodiment, a device 200 (FIG. 2a) may comprise a substrate portion 208, similar to the substrate 108 of FIG. 1a. In an embodiment, the device 200 may comprise a portion of a planar transistor, a multi-gate transistor, such as a tri-gate and/or finFET transistor, and a nanowire structure.

The device 200 may further comprise a gate structure 205, which may comprise a portion of a transistor gate structure 205, such as planar, multi-gate, or a nanowire transistor structure. The gate structure 205 may comprise undoped polysilicon, in an embodiment. The gate structure 205 may further comprise source/drain openings 212 that are disposed adjacent the gate structure 205. Source/drain regions 210 may be disposed in the substrate 208, and may be adjacent the gate structure 205.

The source/drain regions 210 may comprise doped portions of the substrate 208, and may couple with the source/drain openings 212. In an embodiment, a mask, such as a hard mask material 202, may cover a resistor material 204 during an etching process 222 to form the source/drain openings 212. In an embodiment, the resistor material 204 may comprise an undoped polysilicon 204. In an embodiment, the gate structure 205 and an isolation region 215 may comprise polysilicon. In an embodiment, an isolation material, such as a dielectric material, may be disposed between the resistor material 204 and the substrate 208.

Figure 2A:
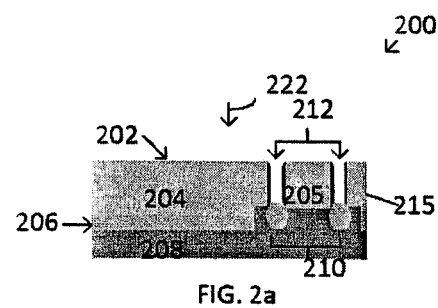
FIGS. 2a-2h represent cross-sectional views of structures according to embodiments.
Figure 2B:
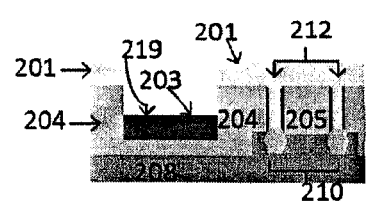

The resistor material 204 may be patterned and etched using a photoresist material 201, and the resistor material may be doped to form a doped resistor material 203 (FIG. 2b). A resistor recess 219 may be formed in the resistor material 203. The depth of the recess 219 formed in the resistor material 204 may depend upon the particular application. In an embodiment, the resistor material 204 of FIG. 2a may be recessed prior to the doping of the resistor material 204 to form the doped resistor material 203.

In an embodiment, the doped resistor material 203 may comprise a boron doped resistor material, although the resistor material 204 may be doped with any suitable doping element, according to the particular application. In an embodiment, a resistivity of the doped resistor material 203 may be established by the type and quantity of the dopant, as well as additional process parameters of the doping process. In an embodiment, a temperature of coefficient of resistance (TCR) for the doped resistor material 203 may comprise about 200 ppm/° C. In some cases, the TCR may comprise about 100 ppm/° C. to about 300 ppm/° C., in other cases, the TCR of the doped resistor material 203 may comprise a negative TCR.

Figure 2C:
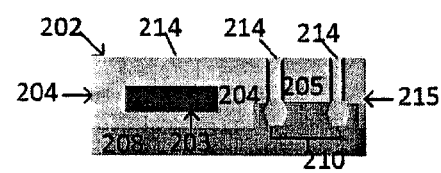
Figure 2D:
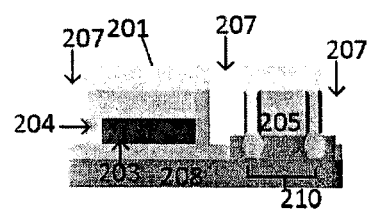
Figure 2E:
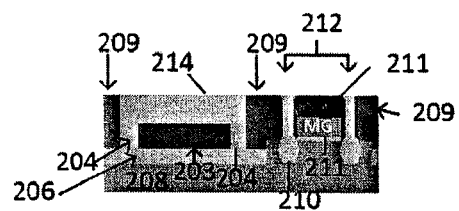

In an embodiment, a dielectric material 214 may be formed on the doped resistor material 203 in the recess and in the source/drain openings 212 (FIG. 2c). The isolation material 214 may be planarized. A masking material 201 may be formed over the doped resistor 203 and over the undoped resistor 204, as well as over the transistor area comprising the metal gate 205 and the source/drain regions 210 (FIG. 2d). Isolation openings 207 may be formed adjacent the source/drain regions 210. Isolation material, such as a dielectric material 109, may be formed in the isolation openings (FIG. 2e). A metal gate 211 may be formed to replace the gate structure 205 material.

Figure 2F:
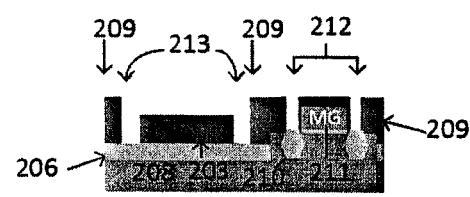

The undoped poly material 204 adjacent the doped resistor 203 may be removed exposing resistor contact openings 213, and the source/drain openings 212 may be exposed (FIG. 2f). The undoped poly material 204, which may comprise anode and cathode structures of the doped resistor 203, may be removed using etching processes such as a dry etch process in an embodiment. In an embodiment, the dielectric material 214 may mask a portion of the doped resistor 203.

Figure 2G:
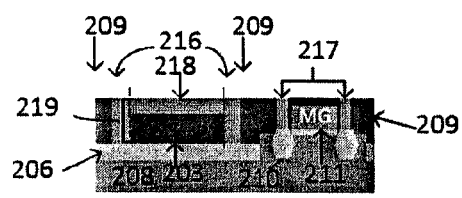

In an embodiment, a contact material 216, 217 may be formed in the source/drain openings 212 and adjacent the doped resistor 203 (FIG. 2g). In an embodiment, contact material 218 may form on a top portion of the doped resistor 203. In an embodiment, the contact material 218 may comprise a TCR that is higher than a TCR of the doped resistor 203. In an embodiment, the contact material 218 may comprise a TCR of over about 900 ppm/° C., while the TCR of the doped resistor 203 may comprise a TCR of about 200 ppm/° C. or below.

In an embodiment, the thickness of the contact material disposed over the doped resistor 203 may depends upon the TCR of the doped resistor 203 and contact material 218. In an embodiment, the contact material 218 formed on the top portion of the doped resistor 203 may serve to tune the TCR of the doped resistor 203, and may comprise a tuneable resistor structure 219. In an embodiment, the tuneable resistor structure 219 may comprise a TCR of about zero. In other cases, the TCR may be tuned by adjusting the thickness of the contact metal 218 to a desired TCR for the particular application.

Figure 2H:
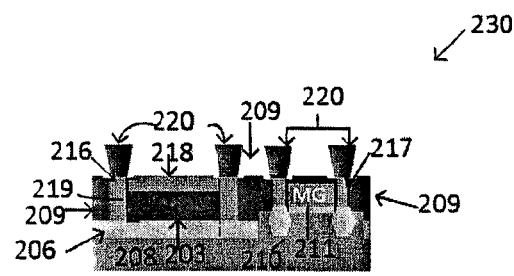

In an embodiment, the contact material may be formed simultaneously adjacent the doped resistor 203 and in the source/drain openings 212 to form resistor contacts 216 and source/drain 217. In an embodiment, the contact material 216, 217 may comprise the same material for the resistor contacts and the source/drain contacts, in other embodiments, the contact material may be different for resistor and source/drain contacts. In an embodiment, conductive interconnect structures 220 may be formed to connect with the resistor contacts 216 and the source/drain contacts 217 (FIG. 2h). The device 230 comprising the tuneable resistor structure 219 allows for the adjustment of the thickness of contact metal 218 over the doped resistor 203, wherein the TCR of the resistor structure 219 can be targeted according to the particular design requirements.

FIGS. 3a-3h illustrate views of embodiments of forming microelectronic resistor structures, such as a tunable TCR resistor structures, wherein the TCR is tuned by forming a high TCR material on a top portion of the resistor material. In an embodiment, a device 300 (FIG. 3a) may comprise a substrate portion 308, similar to the substrate 108 of FIG. 1a. In an embodiment, the device 300 may comprise a portion of a planar transistor, a multi-gate transistor, such as a tri-gate and/or finFET transistor, and a nanowire structure.

The device 300 may further comprise a gate structure 305, which may comprise a portion of a transistor gate structure 305, such as planar, multi-gate, or a nanowire transistor structure. The gate structure 305 may comprise undoped polysilicon, in an embodiment. The gate structure 305 may further comprise source/drain openings 312 that are disposed adjacent the gate structure 305. Source/drain regions 310 may be disposed in the substrate 308, and may be adjacent the gate structure 305.

The source/drain regions 310 may comprise doped portions of the substrate 308, and may couple with the source/drain openings 312. In an embodiment, a mask, such as a hard mask material 302, may cover a resistor material 304 during an etching process 322 to form the source/drain openings 312. In an embodiment, the resistor material 304 may comprise an undoped polysilicon 304. In an embodiment, the gate structure 305 and an isolation region 315 may comprise polysilicon. In an embodiment, an isolation material, such as a dielectric material, may be disposed between the resistor material 304 and the substrate 308.

Figure 3A:
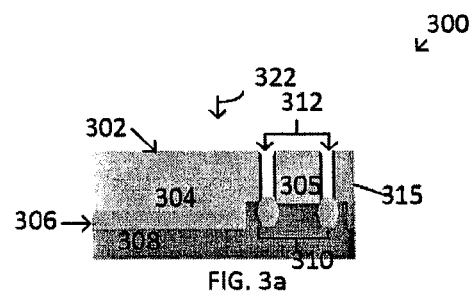
FIGS. 3a-3h represent cross-sectional views of structures according to embodiments.
Figure 3B:
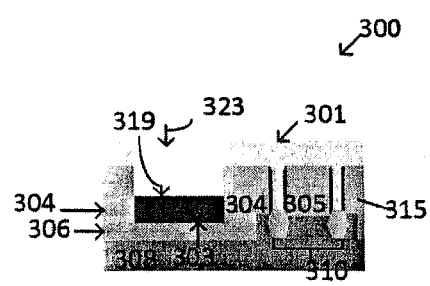

The resistor material 304 may be patterned and etched using a photoresist material 301, and the resistor material may be doped to form a doped resistor material 303 (FIG. 3b). A resistor recess 319 may be formed in the resistor material 303. The depth of the recess 319 formed in the resistor material 304 may depend upon the particular application.

In an embodiment, the doped resistor material 303 may comprise a boron doped resistor material, although the resistor material 304 may be doped with any suitable doping element, according to the particular application. In an embodiment, a resistivity of the doped resistor material 303 may be established by the type and quantity of the dopant, as well as additional process parameters of the doping process. In an embodiment, a temperature of coefficient of resistance (TCR) for the doped resistor material 303 may comprise about 300 ppm/° C. In some cases, the TCR may comprise about 100 ppm/° C. to about 300 ppm/° C., in other cases, the TCR of the doped resistor material 303 may comprise a negative TCR.

Figure 3C:
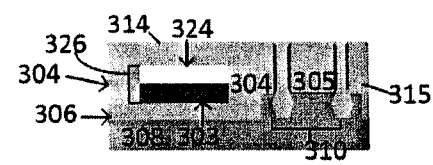

In an embodiment, a high TCR material 324 may be disposed on the doped resistor 303 (FIG. 3c). The high TCR material 324 may comprise a material, such as a resistor material 303, that may be formed on the doped resistor material that may be used to tune the TCR of the doped resistor 303. For example, the high TCR material 324 may comprise but not limited to such materials as Tungsten, Nickel and Cobalt. In an embodiment, the high TCR material 324 and its thickness may be chosen such that when combined with the doped resistor 303, the tuneable compound resistor structure 326 may achieve the desired TCR and resistivity. In an embodiment, the resistivity of the compound resistor 326 may be determined by a ratio of the doped resistor 303 and the high TCR material 324.

Figure 3D:
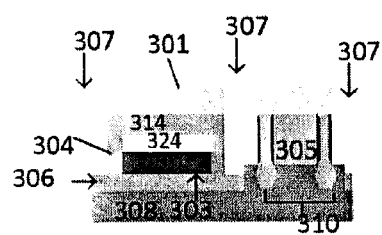
Figure 3E:
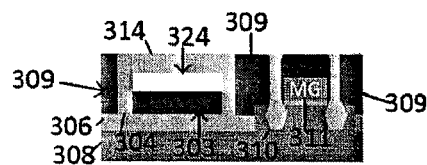

In an embodiment, a dielectric material 314 may be formed on the high TCR material 326 and in the source drain openings 312 (FIG. 3c). The isolation material 314 may be planarized. A masking material 301 may be formed over the doped resistor 303 and over the undoped resistor 304, as well as over the transistor area comprising the metal gate 305 and the source/drain regions 310 (FIG. 3d). Isolation openings 307 may be formed adjacent the source/drain regions 310. Isolation material, such as a dielectric material 309, may be formed in the isolation openings (FIG. 3e). A metal gate 311 may be formed to replace the gate structure 305 material.

Figure 3F:
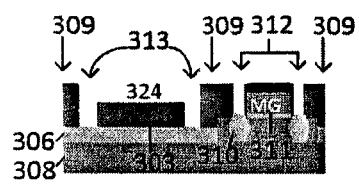

The undoped poly material 304 adjacent the doped resistor 303 may be removed exposing resistor contact openings 313, and the source/drain openings 312 may be exposed (FIG. 3f). The undoped poly material 304, which may comprise anode and cathode structures of the doped resistor 303, may be removed using etching processes such as a dry etch process in an embodiment.

Figure 3G:
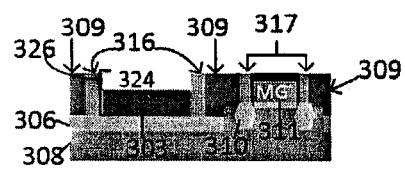
Figure 3H:
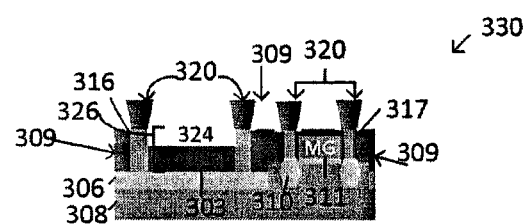

In an embodiment, a contact material 316, 317 may be formed in the source/drain openings 312 and in the resistor contact openings 313 (FIG. 3g). In an embodiment, the contact material 316, 317 may be formed simultaneously adjacent the doped resistor 303 in the resistor contact openings 313 and in the source/drain openings 312 to form resistor contacts 316 and source/drain contacts 317. In an embodiment, the contact material 316, 317 may comprise the same material for the resistor contacts and the source/drain contacts, in other embodiments, the contact material may be different for resistor and source/drain contacts. In an embodiment, conductive interconnect structures 320 may be formed to connect with the resistor contacts 316 and the source/drain contacts 317 (FIG. 3h). The device 330 comprising the tuneable compound resistor structure 326 allows for the adjustment of the doped poly 303, wherein the TCR of the doped poly resistor 303 can be targeted by the selection (TCR, resistivity, thickness, etc.) of the high TCR material 324, according to the particular design requirements.

FIGS. 4a-4h illustrate views of embodiments of forming microelectronic resistor structures, such as a tunable TCR resistor structures, wherein the TCR is tuned by a resistor replacement process. In an embodiment, a device 400 (FIG. 4a) may comprise a substrate portion 408, similar to the substrate 108 of FIG. 1a. In an embodiment, the device 400 may comprise a portion of a planar transistor, a multi-gate transistor, such as a tri-gate and/or finFET transistor, and a nanowire structure.

The device 400 may further comprise a gate structure 405, which may comprise a portion of a transistor gate structure 405. The gate structure 405 may comprise undoped polysilicon, in an embodiment. The gate structure 405 may further comprise source/drain openings 412 that are disposed adjacent the gate structure 405. Source/drain regions 410 may be disposed in the substrate 408, and may be adjacent the gate structure 405.

The source/drain regions 410 may comprise doped portions of the substrate 408, and may couple with the source/drain openings 412. In an embodiment, a mask, such as a hard mask material 402, may cover a resistor material 404 during an etching process 422 to form the source/drain openings 412. In an embodiment, the resistor material 404 may comprise an undoped polysilicon 404. In an embodiment, the gate structure 405 and an isolation region 415 may comprise polysilicon. In an embodiment, an isolation material, such as a dielectric material, may be disposed between the resistor material 404 and the substrate 408.

The resistor material 404 may be patterned and etched using a photoresist material 401 (FIG. 3b). A resistor recess 419 may be formed in the resistor material 403. The depth of the recess 419 formed in the resistor material 404 may depend upon the particular application.

Figure 4A:
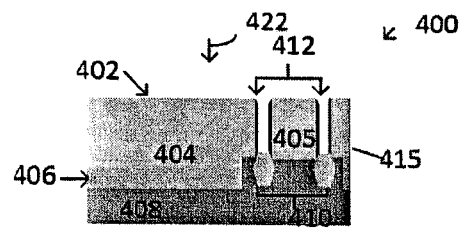
FIGS. 4a-4h represent cross-sectional view of structures according to embodiments.
Figure 4B:
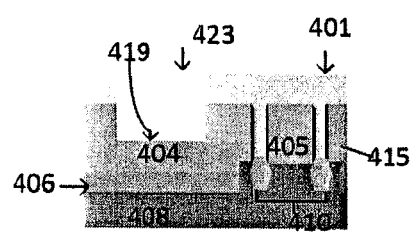
Figure 4C:
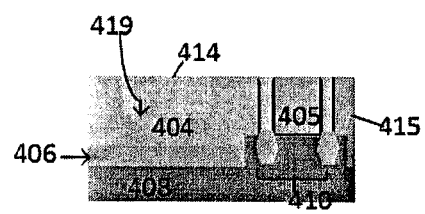
Figure 4D:
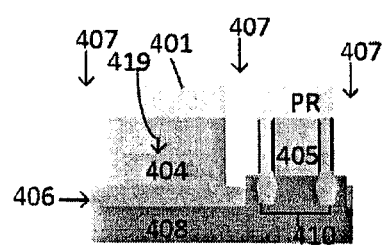
Figure 4E:
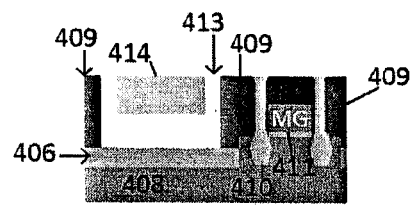

In an embodiment, a dielectric material 414 may be formed on the resistor material 404 and in the source drain openings 412 (FIG. 4c). The isolation material 414 may be planarized. A masking material 401 may be formed over the resistor 404, as well as over the transistor area comprising the metal gate 405 and the source/drain regions 410 (FIG. 4d). Isolation openings 407 may be formed adjacent the source/drain regions 410. Isolation material, such as a dielectric material 409, may be formed in the isolation openings (FIG. 4e). A metal gate 411 may be formed to replace the gate structure 405 material.

Figure 4F:
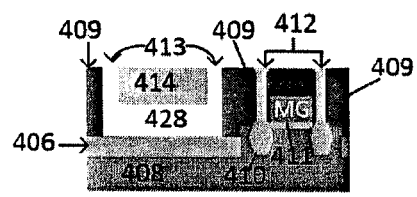

The undoped poly material 404 adjacent the resistor 404 may be removed, and the undoped resistor material underneath the dielectric material 414 may be removed, exposing resistor openings 413. (FIG. 4f). The undoped poly material 404, may be removed using etching processes such as a wet etch process in an embodiment. In an embodiment, a second resistor material 428 may be formed in the resistor opening 413 to replace the undoped poly material 404. The second resistor material 428 may be formed by atomic layer chemical vapor deposition (ALD) and/or chemical vapor deposition (CVD). In an embodiment, the second resistor material 428 may comprise such materials as doped GaAs and Nichrome, and may be chosen to tune/provide the desired TCR value for a particular device application. In an embodiment, the TCR of the second resistor material 428 may be determined by the material choice and thickness of the second resistor material and a contact material 416 interface.

Figure 4G:
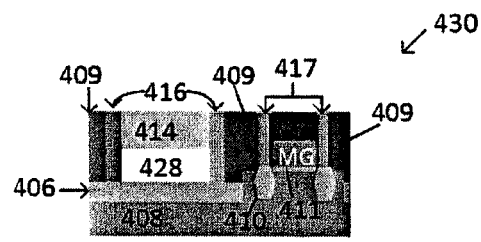
Figure 4H:
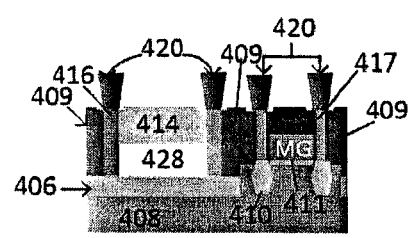

In an embodiment, a contact material 416, 417 may be formed in the source/drain openings 412 and in the resistor contact openings 413 (FIG. 4g). In an embodiment, the contact material 416, 417 may be formed simultaneously adjacent the second resistor 428 in the resistor contact openings 413 and in the source/drain openings 412 to form resistor contacts 416 and source/drain contacts 417. In an embodiment, the contact material 416, 417 may comprise the same material for the resistor contacts and the source/drain contacts, in other embodiments, the contact material may be different for resistor and source/drain contacts. In an embodiment, conductive interconnect structures 420 may be formed to connect with the resistor contacts 416 and the source/drain contacts 417 (FIG. 4h). The device 430 comprising the tuneable second resistor structure 428 allows for the targeting of the TCR of the second resistor 428, by the selection of the second resistor 428 properties (TCR, resistivity, thickness, etc), according to the particular device 430 design requirements.

In an embodiment, the devices of the embodiments herein may comprise circuitry elements such as transistor structures including planar, trigate and nanowire transistor structures, and any other suitable circuitry elements. The circuitry elements may comprise logic circuitry for use in a processor die, for example. Metallization layers and insulative material may be included in the device 100, as well as conductive contacts/bumps that may couple metal layers/interconnects to external devices. The type of elements included in the device 100 may comprise any suitable type of circuit elements, according to the particular application.

In an embodiment, the devices of the embodiments may be coupled with any suitable type of package structures capable of providing electrical communications between a microelectronic device, such as a die and a next-level component to which the package structures may be coupled (e.g., a circuit board). In another embodiment, the device may be coupled with a package structure that may comprise any suitable type of package structures capable of providing electrical communication between a die and an upper integrated circuit (IC) package coupled with the device layer.

The device described in the various Figures herein may comprise a portion of a silicon logic die or a memory die, for example, or any type of suitable microelectronic device/die. In some embodiments the device of the embodiments may further comprise a plurality of dies, which may be stacked upon one another, depending upon the particular embodiment. In some cases the device may be located/attached/ embedded on either the front side, back side or on/in some combination of the front and back sides of a package structure. In an embodiment, the device may be partially or fully embedded in a package structure.

The various embodiments of the resistor structures herein enable the tuning of a TCR for a resistor structure. In embodiments, the resistor structures may be tuned to a zero TCR value. The resistor structures herein provide for consistent resistance regardless of operating temperature of the particular device they in which they are utilized. The embodiments herein enable the integration of the precision resistor embodiments into 3D FINFET structures, nanowire and nanoribbon devices, system on chip (SoC) and other types of 3D architectures. The methods and resistor structures herein provide for a greatly widened resistor material choice, flexibility in resistivity targeting, as well as in TCR targeting.

Figure 5:
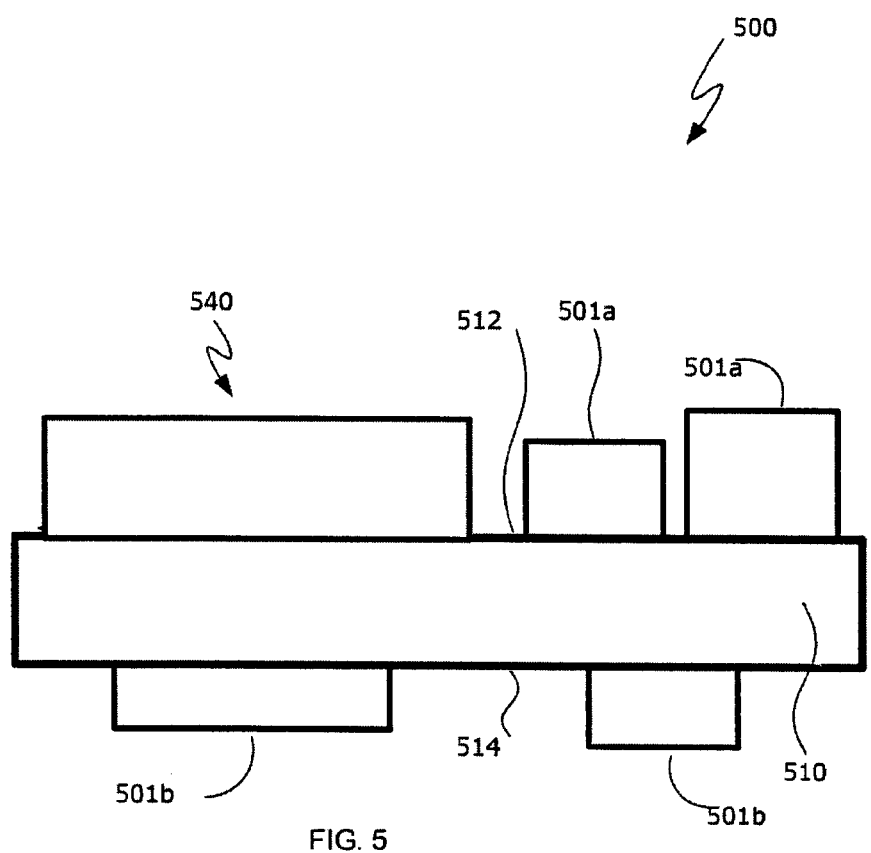
FIG. 5 represents a cross-sectional view of a system according to embodiments.

Turning now to FIG. 5, illustrated is an embodiment of a computing system 500. The system 500 includes a number of components disposed on a mainboard 510 or other circuit board. Mainboard 510 includes a first side 512 and an opposing second side 514, and various components may be disposed on either one or both of the first and second sides 512, 514. In the illustrated embodiment, the computing system 500 includes a package structure 540 disposed on the mainboard's first side 512, wherein the package structure 540 may comprise any of the device structures, such as the devices comprising the passive structures of the embodiments described herein.

System 500 may comprise any type of computing system, such as, for example, a hand-held or mobile computing device (e.g., a cell phone, a smart phone, a mobile internet device, a music player, a tablet computer, a laptop computer, a nettop computer, etc.). However, the disclosed embodiments are not limited to hand-held and other mobile computing devices and these embodiments may find application in other types of computing systems, such as desk-top computers and servers.

Mainboard 510 may comprise any suitable type of circuit board or other substrate capable of providing electrical communication between one or more of the various components disposed on the board. In one embodiment, for example, the mainboard 510 comprises a printed circuit board (PCB) comprising multiple metal layers separated from one another by a layer of dielectric material and interconnected by electrically conductive vias. Any one or more of the metal layers may be formed in a desired circuit pattern to route—perhaps in conjunction with other metal layers—electrical signals between the components coupled with the board 510. However, it should be understood that the disclosed embodiments are not limited to the above-described PCB and, further, that mainboard 310 may comprise any other suitable substrate.

In addition to the package structure 540, one or more additional components may be disposed on either one or both sides 512, 514 of the mainboard 510. By way of example, as shown in the figures, components 501a may be disposed on the first side 512 of the mainboard 510, and components 501b may be disposed on the mainboard's opposing side 514. Additional components that may be disposed on the mainboard 510 include other IC devices (e.g., processing devices, memory devices, signal processing devices, wireless communication devices, graphics controllers and/or drivers, audio processors and/or controllers, etc.), power delivery components (e.g., a voltage regulator and/or other power management devices, a power supply such as a battery, and/or passive devices such as a capacitor), and one or more user interface devices (e.g., an audio input device, an audio output device, a keypad or other data entry device such as a touch screen display, and/or a graphics display, etc.), as well as any combination of these and/or other devices.

In one embodiment, the computing system 500 includes a radiation shield. In a further embodiment, the computing system 500 includes a cooling solution. In yet another embodiment, the computing system 500 includes an antenna. In yet a further embodiment, the assembly 500 may be disposed within a housing or case. Where the mainboard 510 is disposed within a housing, some of the components of computer system 500—e.g., a user interface device, such as a display or keypad, and/or a power supply, such as a battery—may be electrically coupled with the mainboard 510 (and/or a component disposed on this board) but may be mechanically coupled with the housing.

Figure 6:
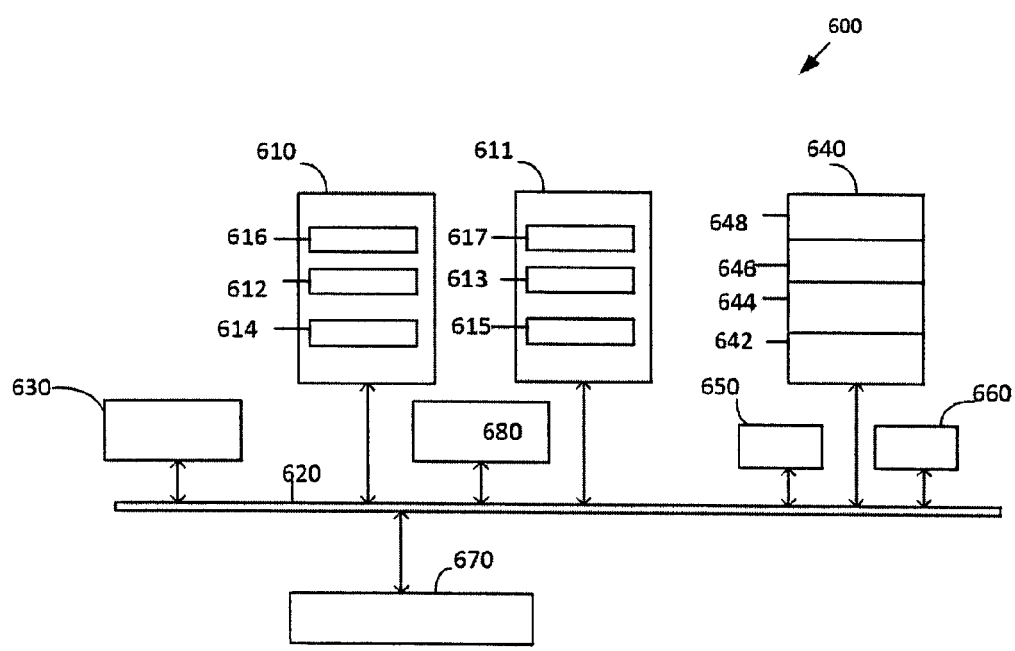
FIG. 6 represents a schematic of a system according to embodiments.

FIG. 6 is a schematic of a computer system 600 according to an embodiment. The computer system 600 (also referred to as the electronic system 600) as depicted can embody/include a device/package structure that includes any of the several disclosed passive structure embodiments and their equivalents as set forth in this disclosure. The computer system 600 may be a mobile device such as a netbook computer. The computer system 600 may be a mobile device such as a wireless smart phone. The computer system 600 may be a desktop computer. The computer system 600 may be a hand-held reader. The computer system 600 may be integral to an automobile. The computer system 600 may be integral to a television.

In an embodiment, the electronic system 600 is a computer system that includes a system bus 620 to electrically couple the various components of the electronic system 600. The system bus 620 is a single bus or any combination of busses according to various embodiments. The electronic system 600 includes a voltage source 630 that provides power to the integrated circuit 610. In some embodiments, the voltage source 630 supplies current to the integrated circuit 610 through the system bus 620.

The integrated circuit 610 is electrically, communicatively coupled to the system bus 620 and includes any circuit, or combination of circuits according to an embodiment, including the package/device structures of the various embodiments included herein. In an embodiment, the integrated circuit 610 includes a processor 612 that can include any type of packaging structures including vertical passive structures according to the embodiments herein. As used herein, the processor 612 may mean any type of circuit such as, but not limited to, a microprocessor, a microcontroller, a graphics processor, a digital signal processor, or another processor. In an embodiment, the processor 612 includes any of the embodiments of the package structures disclosed herein. In an embodiment, SRAM embodiments are found in memory caches of the processor.

Other types of circuits that can be included in the integrated circuit 610 are a custom circuit or an application-specific integrated circuit (ASIC), such as a communications circuit 614 for use in wireless devices such as cellular telephones, smart phones, pagers, portable computers, two-way radios, and similar electronic systems. In an embodiment, the processor 612 includes on-die memory 616 such as static random-access memory (SRAM). In an embodiment, the processor 612 includes embedded on-die memory 616 such as embedded dynamic random-access memory (eDRAM).

In an embodiment, the integrated circuit 610 is complemented with a subsequent integrated circuit 611. In an embodiment, the dual integrated circuit 611 includes embedded on-die memory 617 such as eDRAM. The dual integrated circuit 611 includes an RFIC dual processor 613 and a dual communications circuit 615 and dual on-die memory 617 such as SRAM. The dual communications circuit 615 may be configured for RF processing.

At least one passive device 680 is coupled to the subsequent integrated circuit 611. In an embodiment, the electronic system 600 also includes an external memory 640 that in turn may include one or more memory elements suitable to the particular application, such as a main memory 642 in the form of RAM, one or more hard drives 644, and/or one or more drives that handle removable media 646, such as diskettes, compact disks (CDs), digital variable disks (DVDs), flash memory drives, and other removable media known in the art. The external memory 640 may also be embedded memory 648. In an embodiment, the electronic system 600 also includes a display device 650, and an audio output 660. In an embodiment, the electronic system 600 includes an input device such as a controller 670 that may be a keyboard, mouse, touch pad, keypad, trackball, game controller, microphone, voice-recognition device, or any other input device that inputs information into the electronic system 600. In an embodiment, an input device 670 includes a camera. In an embodiment, an input device 670 includes a digital sound recorder. In an embodiment, an input device 670 includes a camera and a digital sound recorder.

Although the foregoing description has specified certain steps and materials that may be used in the methods of the embodiments, those skilled in the art will appreciate that many modifications and substitutions may be made. Accordingly, it is intended that all such modifications, alterations, substitutions and additions be considered to fall within the spirit and scope of the embodiments as defined by the appended claims. In addition, the Figures provided herein illustrate only portions of exemplary microelectronic devices and associated package structures that pertain to the practice of the embodiments. Thus the embodiments are not limited to the structures described herein.

What is claimed is:

1. A method of forming a resistor structure comprising:
forming an opening in a resistor material adjacent source/drain openings on a device substrate;
doping a portion of the resistor material in the opening, wherein a portion of the resistor material adjacent the doped portion remains undoped;
forming a dielectric material between the undoped resistor portion and the source/drain openings;
modifying the doped resistor material, wherein a temperature coefficient of the resistor material is tuned by the modification; and
forming a contact material adjacent the doped resistor portion, and forming the contact material in the source/drain openings.

2. The method of claim 1 further comprising wherein the temperature coefficient of the resistor material is modified by patterning and etching a portion if the doped resistor subsequent to forming the contact material, wherein the temperature coefficient is tuned by adjusting a length of the doped resistor material.

3. The method of claim 2, wherein an oxide material is disposed on a top portion of the resistor structure.

4. The method of claim 1 further comprising wherein the resistor material comprises a poly silicon material, and wherein the doping comprises a boron doping.

5. The method of claim 1 further comprising wherein the temperature coefficient of the resistor material is modified by forming a portion of the contact material on a top portion of the doped resistor material, wherein the temperature coefficient is tuned by adjusting a thickness of the contact material.

6. The method of claim 1 further comprising; wherein the contact material is formed adjacent the resistor material to form resistor contacts in the resistor opening, and wherein the contact material forms source/drain contacts in source/drain openings, and wherein the resistor contacts and the source/drain contacts are formed simultaneously.

7. The method of claim 6 further comprising wherein the resistor contact comprises a right angle L shape.

8. The method of claim 1 further comprising wherein the temperature coefficient of the doped resistor material is modified by forming, a high temperature coefficient of resistance material on the doped resistor material to form a compound resistor structure.

9. The method of claim 8 wherein a ratio of the doped resistor material and the high temperature coefficient of resistance material is adjusted to tune the temperature coefficient of resistance of the compound resistor material.

10. The method of claim 8 further comprising wherein the high temperature coefficient of resistance, material comprises at least one of Tungsten, Nickel and Cobalt.

11. The method of claim 1 further comprising wherein a metal gate is formed adjacent the source/drain openings prior to the formation of the source/drain contacts.

12. The method of claim 1 further comprising wherein the source/drain contact comprises a portion of a multi-gate transistor.

13. The method of claim 1 further comprising wherein the temperature coefficient of resistance of the resistor comprises about zero ppm/°C.

14. The method of claim 1 wherein undoped portions of the resistor material are removed prior to the formation of the source/drain contacts.

15. A method of forming a resistor structure comprising:
forming a recess in a portion of a resistor material adjacent source/drain openings on a device substrate;
forming a dielectric material between the resistor material and the source/drain openings;
forming a metal gate adjacent the source/drain openings;
removing the resistor material adjacent the dielectric material; forming a second resistor material in the recess, wherein the second resistor material is selected to tune the temperature coefficient of resistance for the resistor structure; and
forming a dielectric material on the second resistor material.

16. The method of claim 15 further comprising wherein the resistor material comprises undoped polysilicon.

17. The method of claim 15 further comprising wherein the second resistor material comprises at least one of doped GaA s and Nichrome, and is formed by ALD/CVD deposition.

18. The method of claim 15 further comprising wherein a metal gate is formed adjacent the source/drain openings.

19. The method of claim 15 further comprising wherein resistor contacts and source/drain contacts are formed adjacent the second resistor material.

* * * * *